(12) United States Patent
Akahane

(10) Patent No.: US 8,405,422 B2
(45) Date of Patent: Mar. 26, 2013

(54) LEVEL SHIFT CIRCUIT

(75) Inventor: Masashi Akahane, Matsumoto (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 40 days.

(21) Appl. No.: 13/241,293

(22) Filed: Sep. 23, 2011

(65) Prior Publication Data

US 2012/0081149 A1 Apr. 5, 2012

(30) Foreign Application Priority Data

Sep. 30, 2010 (JP) ................................. 2010-222359

(51) Int. Cl.
*H03K 19/0175* (2006.01)
*H03K 19/094* (2006.01)
*H03K 3/00* (2006.01)
*H03B 1/00* (2006.01)

(52) U.S. Cl. ................ 326/81; 326/62; 326/63; 326/68; 326/80; 326/82; 326/83; 327/108; 327/109

(58) Field of Classification Search .................... 326/62, 326/63, 68, 80–83, 86; 327/108, 109, 333
See application file for complete search history.

(56) References Cited

U.S. PATENT DOCUMENTS

| | | | |
|---|---|---|---|
| 5,917,359 A | 6/1999 | Fukunaga et al. | |
| 6,501,321 B2 * | 12/2002 | Kumagai | 327/333 |
| 6,531,894 B2 * | 3/2003 | Watabe | 326/82 |
| 6,646,469 B2 * | 11/2003 | Yushan | 326/83 |
| 6,664,822 B2 * | 12/2003 | Watabe | 327/108 |
| 7,049,850 B2 * | 5/2006 | Shimizu | 326/100 |
| 7,323,912 B2 * | 1/2008 | Nielsen | 327/108 |
| 7,495,482 B2 * | 2/2009 | Sakai et al. | 327/108 |
| 7,679,944 B2 * | 3/2010 | Sakurai | 363/98 |
| 2009/0256619 A1 * | 10/2009 | Hsu | 327/379 |

FOREIGN PATENT DOCUMENTS

| | | |
|---|---|---|
| JP | 09-172366 A | 6/1997 |
| JP | 09-200017 B2 | 7/1997 |

* cited by examiner

*Primary Examiner* — Shawki Ismail
*Assistant Examiner* — David M Vassallo
(74) *Attorney, Agent, or Firm* — Rabin & Berdo, P.C.

(57) ABSTRACT

A level shift circuit is disclosed. The circuit includes a series circuit of a resistor and a switching device connected between a high voltage side power supply voltage in a secondary side voltage system and a low voltage side power supply voltage in a primary side voltage system, a series circuit of a resistor and a switching device connected between the high voltage side power supply voltage in the secondary side voltage system and the low voltage side power supply voltage in the primary side voltage system, and a latch malfunction protecting circuit operated in the secondary side voltage system to have voltages at a connection point of the resistor and the switching device and at a connection point of the resistor and the switching device inputted.

10 Claims, 9 Drawing Sheets

LEVEL SHIFT CIRCUIT

BACKGROUND OF INVENTION

1. Technical Field

The present invention relates to a level shift circuit that transmits a signal of a system on the primary side of an input to a system on the secondary side that is operated at an operating voltage different from an operating voltage of the system on the primary side of the input.

2. Background Art

In a circuit such as a half bridge driving circuit to which a power supply voltage of a high voltage system power supply is applied, a level shift circuit is used for driving a switching device on the high voltage side by a signal in a low voltage system.

In Japanese Patent No. 3,429,937, an example of a half bridge driving circuit is shown which uses a level shift circuit. In the following, an explanation will be made with respect to such a related level shift circuit with reference to FIG. 5, a circuit diagram showing a half bridge driving circuit using the related level shift circuit.

In FIG. 5, an output circuit 1 is provided with switching devices XD1 and XD2 connected in series to form a half bridge across which an output voltage E of a high voltage power supply PS is applied. For the switching device XD1 on the high side, a device such as an N-channel or P-channel MOS transistor or an N-type or P-type IGBT (Insulated Gate Bipolar Transistor), for example, is used. For the switching device XD2 on the low side, a device such as an N-channel MOS transistor or an N-type IGBT, for example, is used. Here, for the switching devices XD1 and XD2, N-channel MOS transistors or N-type IGBTs are to be used. To the switching devices XD1 and XD2, diodes $D_H$ and $D_L$ (parasitic diodes or commutating diodes) are connected, respectively, in inverse parallel.

A high side driving unit 2 is provided with the above described level shift circuit, a high side driver 21 that receives the output of the level shift circuit to carry out on-off control of the switching device XD1 and a power supply PS1.

The level shift circuit is a section of the high side driving unit 2 except the high side driver 21 and the power supply PS1. Namely, the level shift circuit is formed of a first series circuit including a resistor LSR1 and an N-channel MOS transistor HVN1, a second series circuit including a resistor LSR2 and an N-channel MOS transistor HVN2, a latch malfunction protecting circuit 22, a latch circuit 23 and diodes D1 and D2. The latch malfunction protecting circuit 22 has one input terminal connected to a series connection point (a first connection point) P1 in the first series circuit and has the other input terminal connected to a series connection point (a second connection point) P2 in the second series circuit.

The level shift circuit makes an output signal SH of the latch circuit 23 inputted to the high side driver 21 as a level-shifted signal.

The output terminal of the high side driver 21 is connected to the gate terminal of the switching device XD1 on the high side. Moreover, the negative side (low voltage side) power supply terminal of each of the latch malfunction protecting circuit 22, the latch circuit 23, the high side driver 21 and the power supply PS1 is connected to a third connection point P3 as a series connection point of the switching devices XD1 and XD2. To the latch malfunction protecting circuit 22, the latch circuit 23 and the high side driver 21, an output voltage E1 of the power supply PS1 is applied.

Each of the first series circuit including the resistor LSR1 and the N-channel MOS transistor HVN1 and the second series circuit including the resistor LSR2 and the N-channel MOS transistor HVN2 is connected between a power supply line L1 (the voltage thereof is to be denoted as Vb), connected to a positive side (high voltage side) terminal of the power supply PS1, and a ground (GND) line L2.

To the gates of the N-channel MOS transistors HVN1 and HVN2, a set signal (set) and a reset signal (reset) as input signals to the level shift circuit are inputted, respectively. The set signal (set) and the reset signal (reset) are signals in the low voltage system.

The set signal (set) is a signal instructing a timing of initiation of the on-period (termination of the off-period) of the switching device XD1 on the high side. The reset signal (reset) is a signal instructing a timing of initiation of the off-period (termination of the on-period) of the switching device XD1.

The diodes D1 and D2 have their anodes commonly connected to the third connection point P3 and have their cathodes connected to the first connection point P1 and the second connection point P2, respectively. The diodes D1 and D2 are provided for the purpose of clamping level shift drain signals (setdrn and resdrn) outputted from the first connection point P1 and the second connection point P2, respectively, so that no voltages of the level shift drain signals become not less than a voltage Vs at the third connection point P3, that is, for the purpose of preventing an overvoltage from being inputted to the latch malfunction protecting circuit 22.

A low side driving unit 3 is provided with a low side driver 31 carrying out on-off control of the switching device XD2 on the low side and a power supply PS2 applying a power supply voltage E2 to the low side driver 31. The low side driver 31 amplifies an input signal to input the amplified signal to the gate terminal of the switching device XD2. The switching device XD2 is turned-on (conducted) when the level of an input signal to the low side driver 31 is an "H (High)" level and is turned-off when the level of an input signal is an "L (Low)" level.

FIG. 6 is a timing chart for explaining a latch operation by a set and reset signals in the level shift circuit. In the timing chart, a set signal (set) with the level thereof becoming the "H" level makes the N-channel MOS transistor HVN1 turned-on to output a level shift drain signal (setdrn) with an "L" level from the first connection point P1. While, a reset signal (reset) with the level thereof becoming the "H" level makes the N-channel MOS transistor HVN2 turned-on to output a level shift drain signal (resdrn) with an "L" level from the second connection point P2.

Here, as is shown by a chain line in FIG. 5, consider a state in which the latch malfunction protecting circuit 22 is ignored to allow the level shift drain signals (setdrn and resdrn) to be directly inputted from the first and second connection points P1 and P2, respectively, to the latch circuit 23. In this case, in a period from the time at which the level of the level shift drain signal (setdrn) changes from an "H" level to an "L" level to the time at which the level of the level shift drain signal (resdrn) changes from an "H" level to an "L" level, the latch circuit 23 latches (holds) an "H" level to provide the output signal SH as an "H" level signal to the high side driver 21. Therefore, in the latch period, by an "H" level signal "HO" outputted from the high side driver 21, the switching device XD1 is to be turned-on.

The turning-on and -off of the switching devices XD1 and XD2 are carried out mutually complementarily (when the one is made turned-on, the other is made turned-off) except for a dead time in which both of them are made turned-off together. Then, a voltage Vs at the third connection point P3 becomes approximately the ground voltage when the switching device XD2 is turned-on and becomes the voltage approximately equal to the output voltage E of the high voltage power supply PS when the switching device XD1 is turned-on.

A load RL is connected between the third connection point P3 and the ground line L2 to be driven by the electric power outputted from the third connection point P3.

Here, consider the instant when a state in which the switching device XD2 is turned-on is switched into a state in which the switching device XD1 is turned-on. With the switching between both of the states, the voltage Vs at the third connection point P3 is promptly increases from the ground voltage to the output voltage E of the high voltage power supply PS as shown in FIG. 7, a timing chart for explaining dv/dt noises. At this time, both of the N-channel MOS transistors HVN1 and HVN2 made turned-off together cause erroneous signals known as dv/dt noises that will be explained later to be superposed on signals at the first and second connection points P1 and P2, respectively, which results in "L" levels in the levels of the first and second connection points P1 and P2 together. When the voltage levels of the first and second connection points P1 and P2, respectively, become "L" levels together, a malfunction is to be induced that causes the operation of the latch circuit 23 (formed by a set-reset flip-flop, for example) to be indeterminate, that is, a malfunction that causes the switching device XD1 to be indeterminate as to whether the switching device XD1 is turned-on or turned-off. In FIG. 7, the level shift drain signals (setdrn and resdrn) before the increase in the voltage Vs are regular signals being the same as those shown in FIG. 6. In the following, an explanation will be made with respect to dv/dt noises.

The voltage Vb of the power supply line L1 becomes a voltage which is a sum of the voltage Vs and the output voltage E1 as a constant voltage. Therefore, the rising of the voltage Vs is to cause the similar rising of the voltage Vb (both voltages have equal differential coefficients). Namely, the voltage Vb applied to the first series circuit including the resistor LSR1 and the N-channel MOS transistor HVN1 and the second series circuit including the resistor LSR2 and the N-channel MOS transistor HVN2 is to increase.

Because of the presence of parasitic capacitances Cds1 and Cds2 between the source and drain of the N-channel MOS transistor HVN1 and between the source and drain of the N-channel MOS transistor HVN2, respectively, when the variation in the voltage Vb is prompt, the voltage changes at the first and second connection points P1 and P2, respectively, can not follow the variation. This increases the potential difference between the voltage Vb and each of the first and second connection points P1 and P2. This, when viewed from the latch circuit 23, is to cause the voltage at each of the terminals of the latch circuit 23 to decrease simultaneously. The above described dv/dt noises are thus produced.

The latch malfunction protecting circuit 22 is provided for the purpose of avoiding the influences of the dv/dt noises. In the following, an example of the configuration of the latch malfunction protecting circuit 22 and its operation will be explained with reference to FIG. 8, a circuit diagram showing an example of a configuration of a related latch malfunction protecting circuit.

In the latch malfunction protecting circuit 22, one of input terminals to which a level shift drain signal (setdrn) is inputted is connected to one of input terminals of a NOR circuit G1 and, along with this, is connected to one of input terminals of a NAND circuit G3 through an inverter circuit G2. Moreover, the other input terminal to which a level shift drain signal (resdrn) is inputted is connected to the other input terminal of the NOR circuit G1 and, along with this, is connected to one of input terminals of a NAND circuit G5 through an inverter circuit G4. In addition, the output terminal of the NOR circuit G1 is connected to the other input terminal of the NAND circuit G3 and the other input terminal of the NAND circuit G5 through an inverter circuit G6.

The latch malfunction protecting circuit 22 having such a configuration is operated as follows. Namely, when the dv/dt noises shown in FIG. 7 are produced at the first and second connection points P1 and P2, the dv/dt noises are respectively inputted to both of the input terminals of the latch malfunction protecting circuit 22. At this time, from the inverter circuits G2 and G4, "H" level signals are respectively outputted and, from the NOR circuit G1, an "H" level signal is outputted. As a result, an "L" level signal is outputted from the inverter circuit G6. Thus, from each of the NAND circuits G3 and G5, an "H" level signal is to be outputted as an output signal of the latch malfunction protecting circuit 22.

The latch circuit 23 connected to the latch malfunction protecting circuit 22 is formed with a circuit such as a reset-set flip-flop operated with input signals in negative logic (a set or reset operation is carried out with an input in an "L" level). Therefore, the latch circuit 23 carries out no latch operation when a signal in an "H" level is inputted to a set terminal or a reset terminal. Namely, the latch circuit 23 keeps the state before dv/dt noises are produced to cause the signal in the "H" level to be inputted thereto, by which the switching devices XD1 is also made to keep the previous state. In this way, the latch malfunction protecting circuit 22 functions so as to prevent the latch circuit 23 from being brought into an indeterminate state (see FIG. 7) when dv/dt noises are produced, that is, so as to protect the latch circuit 23 against malfunction.

[Patent Document 1] Japanese Patent No. 3,429,937

In the level shift circuit, when the level of the set signal (set-1) becomes an "H" level as shown in FIG. 9, a timing chart for explaining operations of the related level shift circuit shown in FIG. 5, the N-channel MOS transistor HVN1 is turned-on, by which the level of a level shift drain signal (setdrn-1) changes to an "L" level. In this case, there is no change in the level of the reset signal to operate no latch malfunction protecting function of the latch malfunction protecting circuit 22. Thus, the latch circuit 23 carries out a normal latch operation. As a result, an output signal HO-1 of the high side driver 21 rises with a delay by a delay time to characteristic to the circuits 22 and 23 and the high side driver 21 to turn-on the switching device XD1. The turning-on of the switching devices XD1 causes a level shift drain signal (resdrn) with an "L" level to be outputted from the second connection point P2 by the above described dv/dt noise produced with the rising of the voltage Vs. The signal (resdrn), however, is blocked by the latch malfunction protecting circuit 22. Therefore, the latch circuit 23 keeps the latch operation thereof.

Incidentally, the voltage Vs normally increases when the switching device XD1 is switched from a turned-off state to a turned-on state (at this time the switching device XD2 is switched from a turned-off state to a turned-on state). In addition to this, however, the voltage Vs sometimes increases also in a dead time (set for preventing a feedthrough current from flowing) in which both of the switching devices XD1 and XD2 are made turned-off.

Namely, the turning-off of the switching device XD2 when the switching device XD2 is in a state of being turned-on to cause a current to be flowing from the load RL (to be an inductive load that makes prompt cut off of a current hard) to the output circuit 1 as a component of the converter (when the switching device XD2 is in a state of becoming a current sink device) causes a current, flowing in from the load RL in the dead time, to have nowhere to flow in. Thus, stray capacitance of the line at the voltage Vs (the line connected to the third connection point P3) is charged by the current to promptly increase the voltage Vs.

Moreover, an increase in the voltage Vs up to the voltage of making the diodes $D_H$ connected in parallel to the switching device XD1 (the output voltage E of the high voltage power supply PS +the forward voltage of the diode $D_H$) makes the diode $D_H$ turned-on so as to allow a current to come to flow from the load RL to the high voltage power supply PS through the diodes $D_H$.

Here, an explanation will be made with respect to the case in which the level of a set signal (set-2) becomes "H" level when the voltage Vs is rising due to the presence of a dead time, that is, the case in which the rising period of the voltage Vs and the time at which the level of the set signal (set-2) becomes "H" level are simultaneous.

In this case, with each of the levels of the level shift drain signals (setdrn-2 and resdrn) being brought to "L" level by dv/dt noises produced with the rising of the voltage Vs, that is, with the latch malfunction protecting circuit 22 carrying out a protecting operation, the level of the set signal (set-2) becomes "H" level. Therefore, until the protecting operation period of the latch malfunction protecting circuit 22 is terminated (until the period during which dv/dt noises are produced is terminated), the set signal (set-2) is not transmitted to the latch circuit 23 to thereby cause an output signal HO-2 of the high side driver 21 to be to rise after a long blank period (tb (>ta)).

Furthermore, in the case when the level of the set signal (set-3) becomes "H" level after the rising of the voltage Vs due to the presence of a dead time has terminated, the level of the set signal (set-3) becomes "H" level with no malfunction protecting function of the latch malfunction protecting circuit 22 being operated. Thus, an output signal HO-3 of the high side driver 21 rises with a delay by the delay time to characteristic to the circuits 22 and 23 and the high side driver 21 and, at the same time, the switching device XD1 is made turned-on.

In the case in which the voltage Vs rises in a period such as a dead time period as is described above, the turning-on operation of the switching device XD1 is largely delayed due to the above blank period tb, so that a power loss by the diodes $D_H$ connected in parallel to the switching devices XD1 becomes a problem. Thus, a technique is desired which permits the fastest possible turning-on of the switching device XD1.

Accordingly, an object of the invention is to provide a level shift circuit which can reduce the delay in the turning-on operation caused by a circuit that takes countermeasures against dv/dt noises produced by a high side switching device forming a circuit such as a half bridge.

SUMMARY OF THE DISCLOSURE

For achieving the object, the level shift circuit according to the invention is a level shift circuit transmitting an input signal from a primary side voltage system to a system operated by a secondary side voltage system different from the primary side voltage system, the circuit including: a series circuit of a first resistor and a first switching device, the series circuit being connected between a high voltage side power supply voltage in the secondary side voltage system and a low voltage side power supply voltage in the primary side voltage system; a series circuit of a second resistor and a second switching device, the series circuit being connected between the high voltage side power supply voltage in the secondary side voltage system and the low voltage side power supply voltage in the primary side voltage system; a latch malfunction protecting circuit operated in the secondary side voltage system, having a voltage at a first connection point inputted which point is a connection point of the first resistor and the first switching device and, along with this, having a voltage at a second connection point inputted which point is a connection point of the second resistor and the second switching device; a latch circuit operated in the secondary side voltage system and having an output of the latch malfunction protecting circuit inputted; a third switching device connected in parallel to the first resistor; a fourth switching device connected in parallel to the second resistor; and a logic gate circuit operated in the secondary side voltage system and having the voltages at the first and second connection points inputted.

The first switching device has a signal in the primary side voltage system controlling turning-on and -off of the first switching device inputted and the second switching device has a signal in the primary side voltage system controlling turning-on and -off of the second switching device inputted, the latch malfunction protecting circuit is formed so as to transmit a signal determined on the basis of the voltages at the first and second connection points when any one of the first and second switching devices is turned-on, and so as not to transmit the signal determined on the basis of the voltages at the first and second connection points when the first and second switching devices are simultaneously turned-on, and the logic gate circuit is formed so as to make the third and fourth switching devices turned-on when both of the voltages at the first and second connection points are lower than the threshold voltage of the logic gate circuit.

The level shift circuit is capable of further including a feedback circuit that pulls up the voltage at one of the first and second connection points to the high voltage side power supply voltage in the secondary side voltage system and, along with this, pulls down the voltage at the other connection point to the low voltage side power supply voltage in the secondary side voltage system.

The feedback circuit is provided with a third resistor with one end thereof connected to the first connection point and the other end having an inverting signal of the output signal of the latch circuit applied and a fourth resistor with one end thereof connected to the second connection point and the other end having a non-inverting signal of the output signal of the latch circuit applied.

The latch malfunction protecting circuit is formed, for example, so as to make the output impedance thereof provided as a high impedance when both of the voltages at the first and second connection points are lower than the threshold voltage of the latch malfunction protecting circuit.

The latch malfunction protecting circuit is formed, for example, so as to include: an inverting device; a P-channel MOS transistor series circuit in which a first and second P-channel MOS transistors are connected in series; and an N-channel MOS transistor series circuit in which a first and second N-channel MOS transistors are connected in series.

In this case, the P-channel MOS transistor series circuit and the N-channel MOS transistor series circuit are connected in series between the high voltage side power supply voltage and the low voltage side power supply voltage in the secondary side voltage system, and the first connection point is connected to gates of the first P-channel MOS transistor and first N-channel MOS transistor and, along with this, the second connection point is connected to an input terminal of the inverting device. Moreover, an output terminal of the inverting device is connected to gates of the second P-channel MOS transistor and second N-channel MOS transistor, and a connection point of the P-channel MOS transistor series circuit and the N-channel MOS transistor series circuit are connected to a data input terminal of the latch circuit.

The threshold voltage of the logic gate circuit is set to be not more than the threshold voltage of the latch malfunction protecting circuit.

Moreover, the latch circuit is formed by, for example, a buffer circuit with a resistor connected between the input side and the output side of the buffer circuit. In this case, the buffer circuit can be formed by two inverting devices connected in series.

The level shift circuit according to the invention can be further provided with a third P-channel MOS transistor connected in parallel to the first resistor and a fourth P-channel MOS transistor connected in parallel to the second resistor. The third P-channel MOS transistor has a gate connected to the connection point of the second resistor and the fourth resistor, and the fourth P-channel MOS transistor has a gate connected to the connection point of the first resistor and the third resistor.

Moreover, the inverting signal of the output signal of the latch circuit has the low voltage side power supply voltage in the secondary side voltage system and, along with this, a voltage dividing ratio by the first resistor and the third resistor is determined so that the voltage at the first connection point when the first switching device and the third switching device are turned-off is between the voltage, given by subtracting the threshold voltage of the fourth P-channel MOS transistor from the high voltage side power supply voltage in the secondary side voltage system, and the voltage, given by adding the threshold voltage of the latch malfunction protecting circuit relative to the voltage at the first connection point to the low voltage side power supply voltage in the secondary side voltage system.

Furthermore, the non-inverting signal of the output signal of the latch circuit has the low voltage side power supply voltage in the secondary side voltage system and, along with this, a voltage dividing ratio by the second resistor and the fourth resistor is determined so that the voltage at the second connection point when the second switching device and the fourth switching device are turned-off is between the voltage, given by subtracting the threshold voltage of the third P-channel MOS transistor from the high voltage side power supply voltage in the secondary side voltage system, and the voltage, given by adding the threshold voltage of the latch malfunction protecting circuit relative to the voltage at the second connection point to the low voltage side power supply voltage in the secondary side voltage system.

According to the invention, the delay in the turning-on operation can be reduced which delay occurs in a period such as a dead time period of a high side switching device forming a circuit such as a half bridge. Therefore, it is possible to reduce the power loss due to the diode connected in parallel to the switching device.

DESCRIPTION OF THE PREFERRED EMBODIMENT

Figure 1:
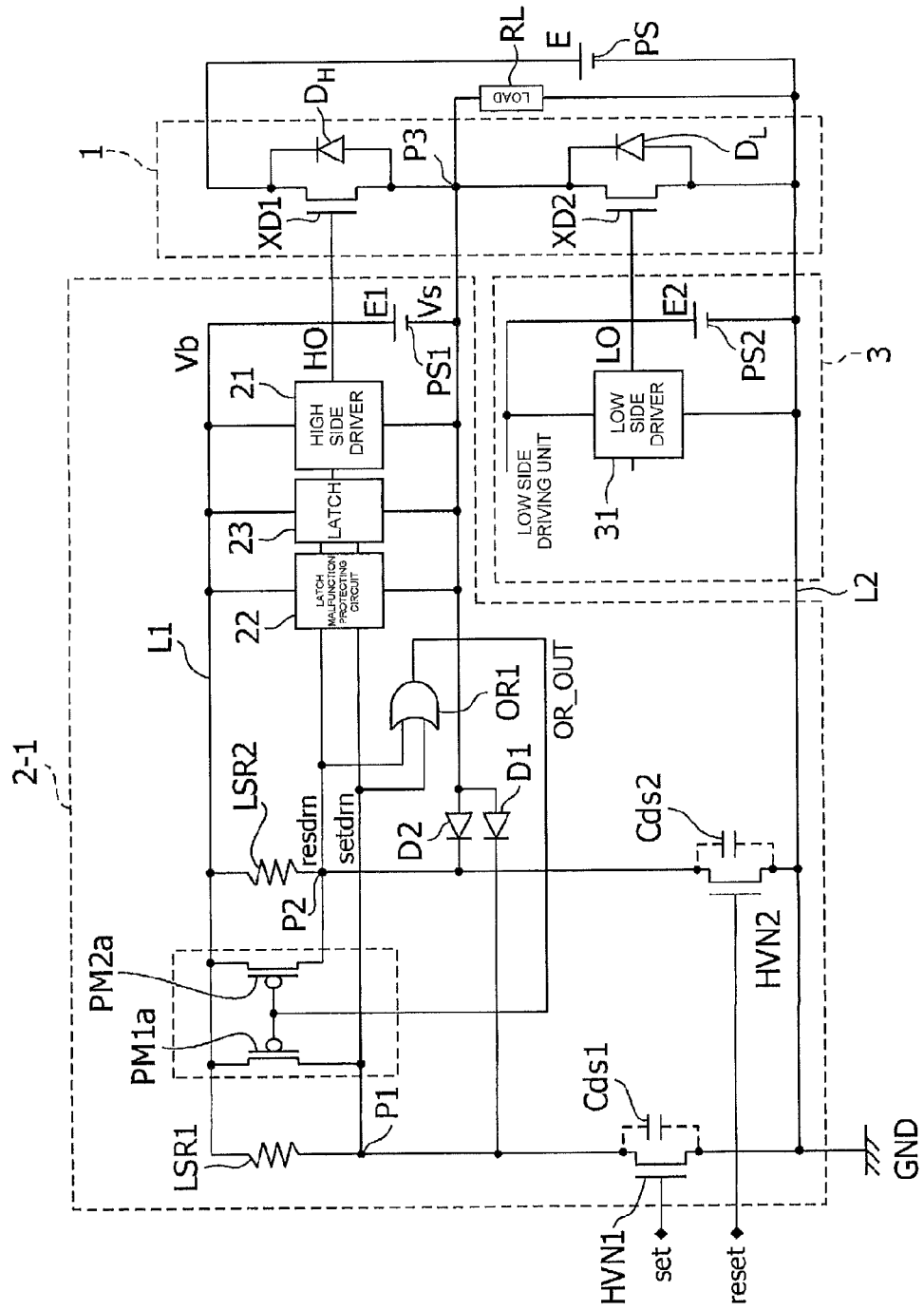
FIG. 1 is a circuit diagram showing a half bridge driving circuit using a level shift circuit according to an embodiment of the invention.

In FIG. 1, a circuit diagram of a half bridge driving circuit is shown which uses a level shift circuit according to an embodiment of the invention. In the half bridge driving circuit, the level shift circuit is provided in a high side driving unit 2-1. In FIG. 1, the constituents common to those in the example of the related half bridge driving circuit shown in FIG. 5 are denoted with the same or corresponding reference numerals and signs with detailed explanations thereof omitted.

Figure 5:
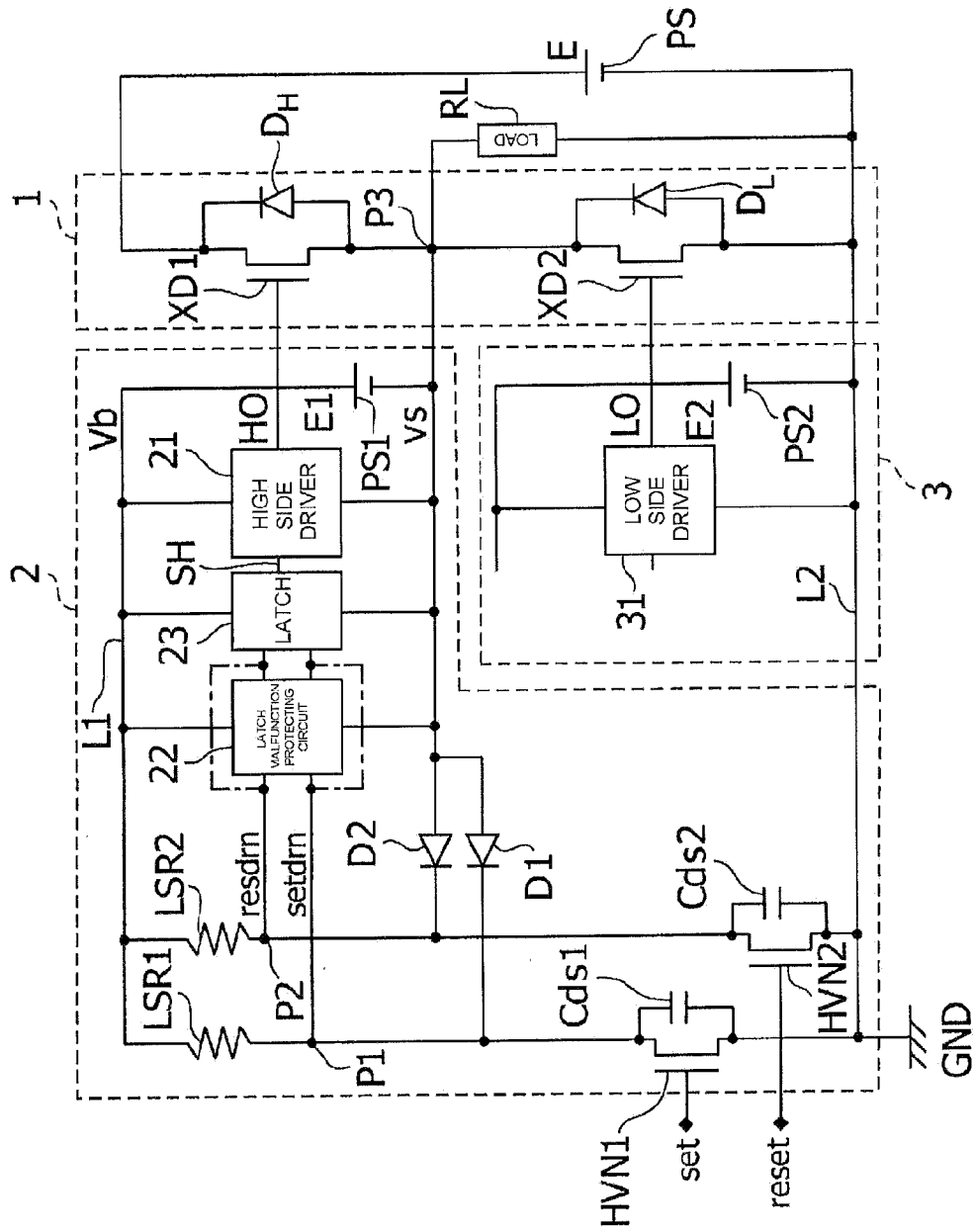
FIG. 5 is a circuit diagram showing a half bridge driving circuit using a related level shift circuit.
Figure 6:
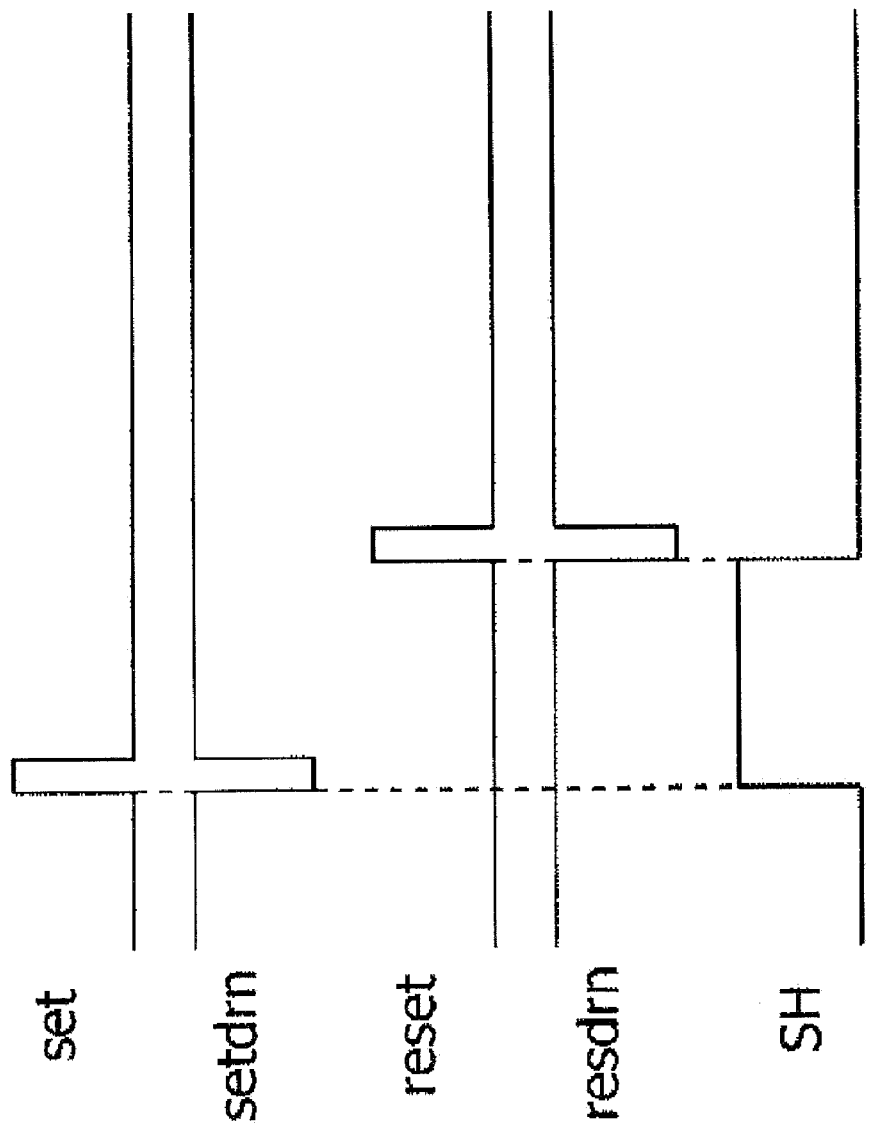
FIG. 6 is a timing chart for explaining a latch operation by a set and reset signals in a level shift circuit.
Figure 7:
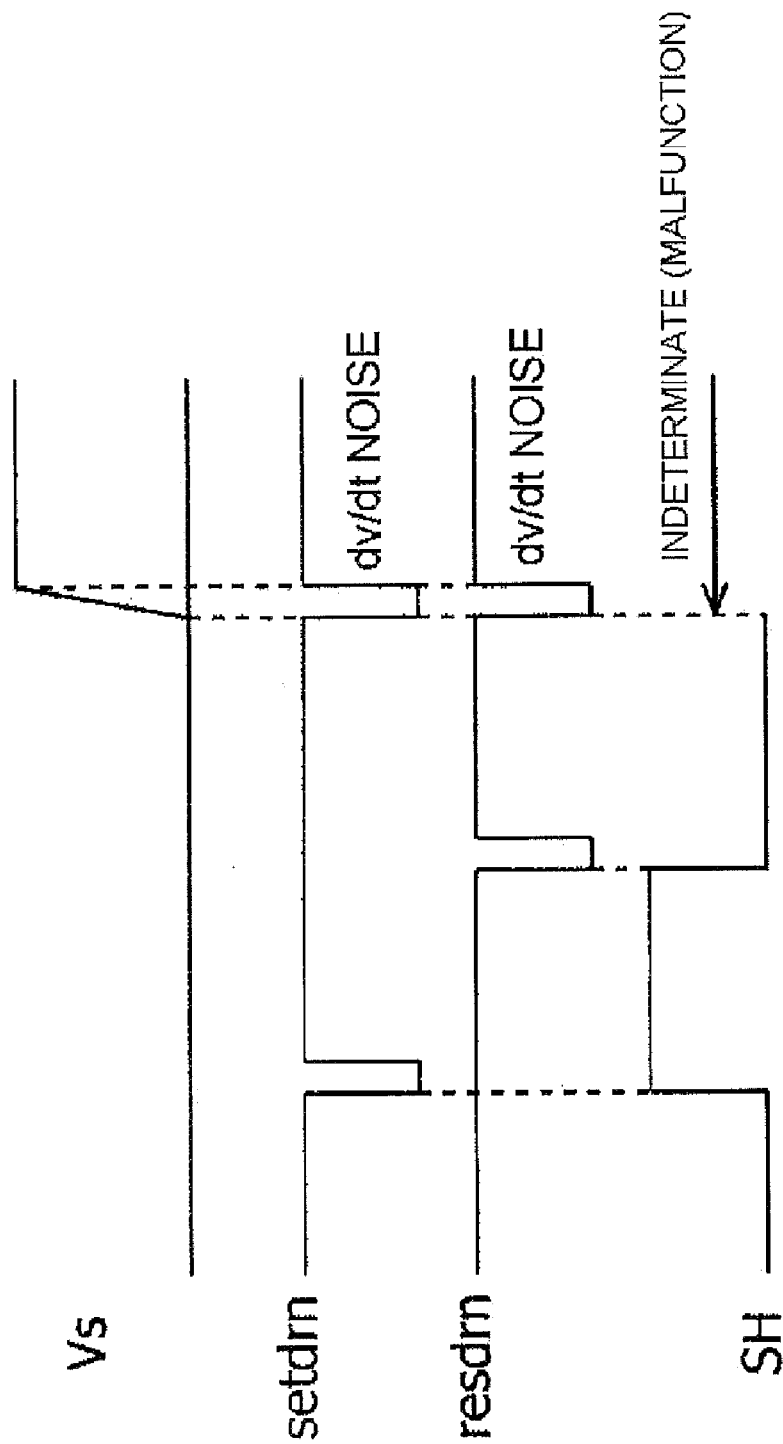
FIG. 7 is a timing chart for explaining dv/dt noises.

The level shift circuit according to the embodiment has a configuration in which P-channel MOS transistors PM1$a$ and PM2$a$ and a two-input logical sum circuit OR1 as a logic gate circuit are added to the constituents in the example of the related level shift circuit shown in FIG. 5.

Figure 2:
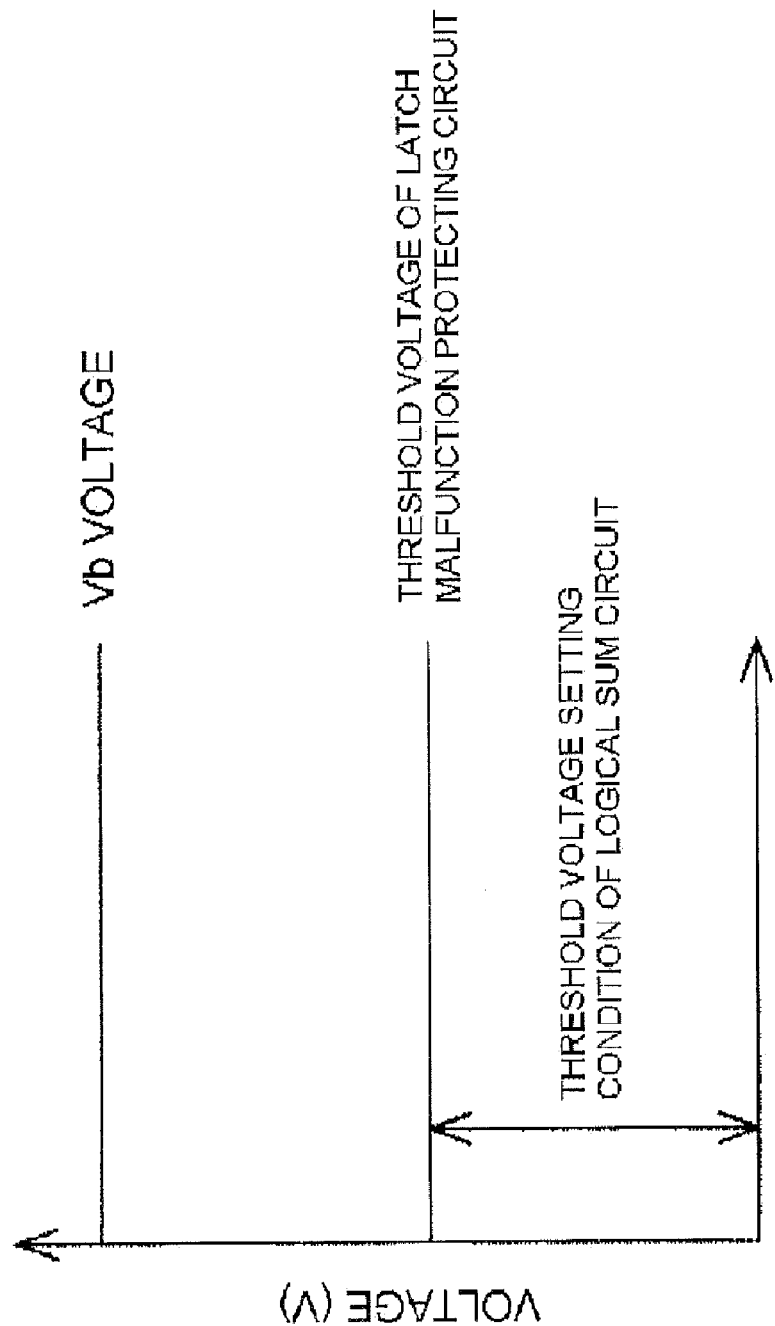
FIG. 2 is a diagram illustrating a condition for setting the threshold voltage of a logical sum circuit.

The P-channel MOS transistors PM1$a$ and PM2$a$ are connected in parallel to the resistors LSR1 and LSR2, respectively. The logical sum circuit OR1 has one of input terminals connected to the first connection point P1, the other input terminal connected to the second connection point P2 and an output terminal connected to a gate terminal of each of the P-channel MOS transistors PM1$a$ and PM2$a$. The threshold voltage of the logical sum circuit OR1 is set to be not more than the threshold voltage of the latch malfunction protecting circuit 22 as shown in FIG. 2, a diagram illustrating a condition for setting the threshold voltage of the logical sum circuit OR1.

In the following, an operation of the level shift circuit according to the embodiment will be explained with reference to FIG. 3, a timing chart corresponding to that shown in FIG. 9.

Figure 3:
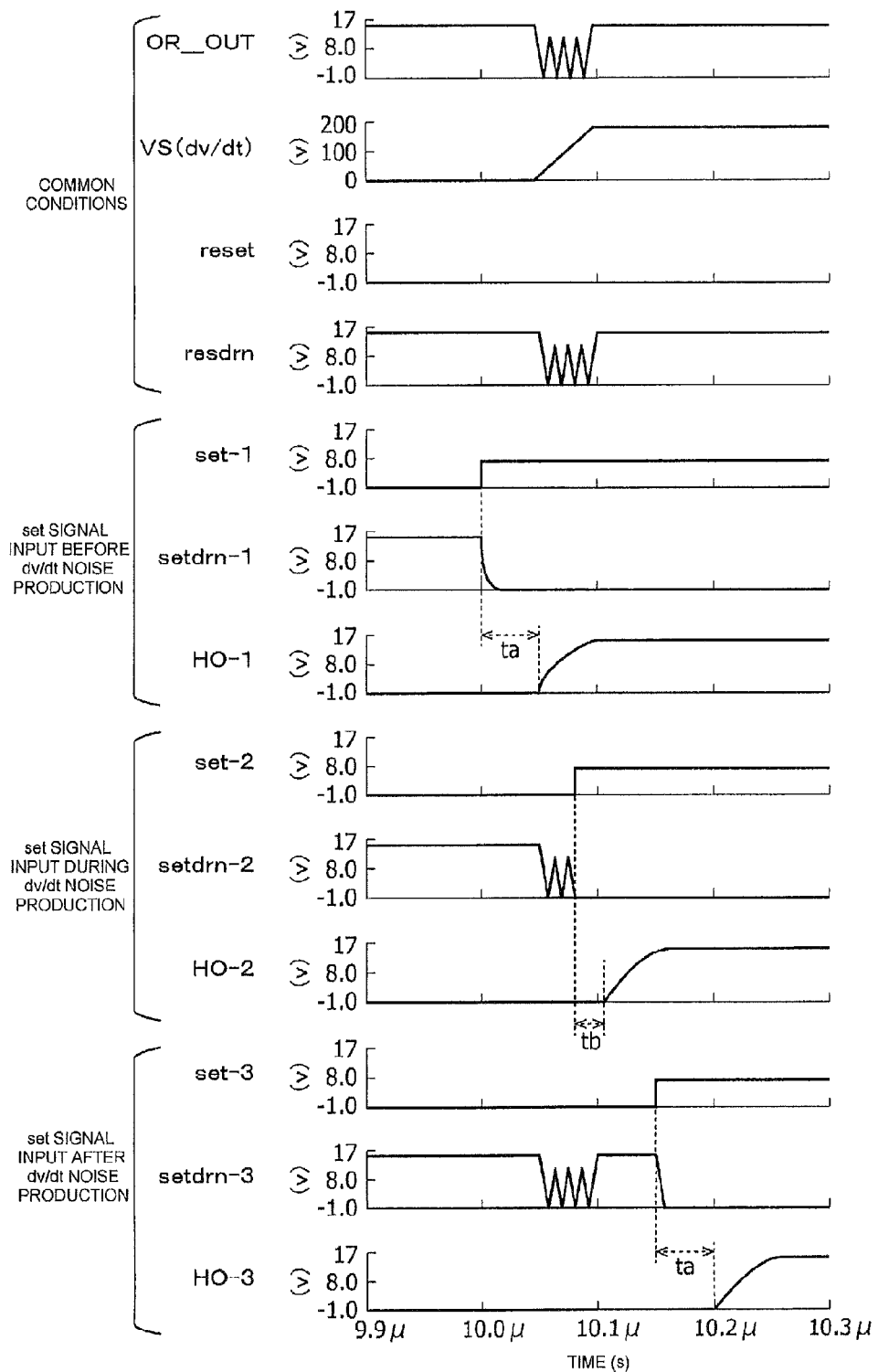
FIG. 3 is a timing chart for explaining operations of the level shift circuit shown in FIG. 1.

As shown in FIG. 3, when the level of a set signal (set-1) becomes "H" level, an N-channel MOS transistor HVN1 is turned-on to make a level shift drain signal (setdrn-1) with "L" level outputted from the first connection point P1. In this case, no latch malfunction protecting function of a latch malfunction protecting circuit 22 is operated to allow a latch circuit 23 to carry out a latch operation. As a result, an output signal HO-1 of a high side driver 21 rises with a delay by a delay time to characteristic to the circuits 22 and 23 and the high side driver 21 to turn-on a switching device XD1 on the high side.

The turning-on of the switching device XD1 reduces the voltage of a level shift drain signal (resdrn) by the dv/dt noises produced with an increase in a voltage Vs. Then, when the voltage of the level shift drain signal (resdrn) becomes not more than the threshold voltage of the logical sum circuit OR1, since the level of the other level shift drain signal (setdrn-1) inputted to the logical sum circuit OR1 has been "L" level since before, the level of an output signal OR_OUT becomes "L" level. This makes the P-channel MOS transistors PM1$a$ and PM1$b$ turned-on to reduce the impedance between the source and drain of each of the P-channel MOS transistors PM1$a$ and PM1$b$. The reduction in the impedance works to cancel the voltage drop in each of the level shift drain signals (setdrn-1 and resdrn), which makes the voltage of each of the level shift drain signals (setdrn-1 and resdrn) change to tend to increase. Here, FIG. 3 shows with respect to the case in which the on-resistance of each of the N-channel MOS transistors HVN1 and HVN2 is set so as to become considerably lower than the on-resistance of each of the P-channel MOS transistors PM1$a$ and PM2$a$, by which the level shift drain signal (setdrn-1) causes no oscillation with its level being kept at "L" level when the N-channel MOS transistor HVN1 is being turned-on by the set signal (set-1).

When the voltages of the level shift drain signals (setdrn-1 and resdrn) increase and a voltage of either one of the signals exceeds the threshold voltage of the logical sum circuit OR1, the level of the output signal OR_OUT becomes "H" level. As a result, both of the P-channel MOS transistors PM1$a$ and PM2$a$, having the "H" level output signal OR_OUT inputted to their gate, are turned-off to increase an impedance between the source and gate of each of the P-channel MOS transistors PM1$a$ and PM2$a$ to change the voltages of the level shift drain signals (setdrn-1 and resdrn) to reduction. This causes the level of the output signal OR_OUT of the logical sum circuit OR1 to become "L" level to turn-on both of the P-channel MOS transistors PM1$a$ and PM2$a$ again.

While dv/dt noises are being produced, such operations are carried out repeatedly. Thus, each of the output signal of the logical sum circuit OR1 and the level shift drain signals (setdrn-1 and resdrn) becomes to have an oscillated waveform. Incidentally, as was explained above, the turning-on of the N-channel MOS transistor HVN1 terminates the oscillation of the level shift drain signal (setdrn-1).

Subsequent to this, an explanation will be made with respect to the case in which the level of a set signal (set-2) becomes "H" level when the voltage Vs is rising due to the dead time, that is, the case in which the rising period of the voltage Vs coincides with the time at which the level of the set signal (set-2) becomes "H" level. Here, until the level of the set signal (set-2) becomes "H" level, both of the levels of the two level shift drain signals (setdrn-1 and resdrn) are either "H" levels or "L" levels, which therefore causes no change in the latch circuit 23. Namely, when the levels of both of the level shift drain signals (setdrn-1 and resdrn) are "L" levels, input signals to the latch circuit 23 are blocked by the latch malfunction protecting circuit 22. While, when the levels of both of the level shift drain signals (setdrn-1 and resdrn) are "H" levels, input signals to the latch circuit 23 are of negative logic, which causes no change in the latch circuit 23.

In this case, when dv/dt noises are being produced with the rising of the voltage Vs, namely, with the output signal of the logical sum circuit OR1 and the level shift drain signals (setdrn-2 and resdrn) showing oscillating waveforms, the level of the set signal (set-2) changes to "H" level. The change in the level of the set signal (set-2) to "H" level makes the N-channel MOS transistor HVN1 turned-on which forms a common source amplifying circuit on the "set" side, by which the level of the level shift drain signals (setdrn-2) becomes "L" level. This, even in the case in which a change due to a dv/dt noise is occurring in the level of the level shift drain signal (resdrn) with a timing of making the level become "H" level by the oscillation, makes it possible to transmit the set signal (set-2) to the latch circuit 23 without being blocked by the latch malfunction protecting circuit 22.

Figure 9:
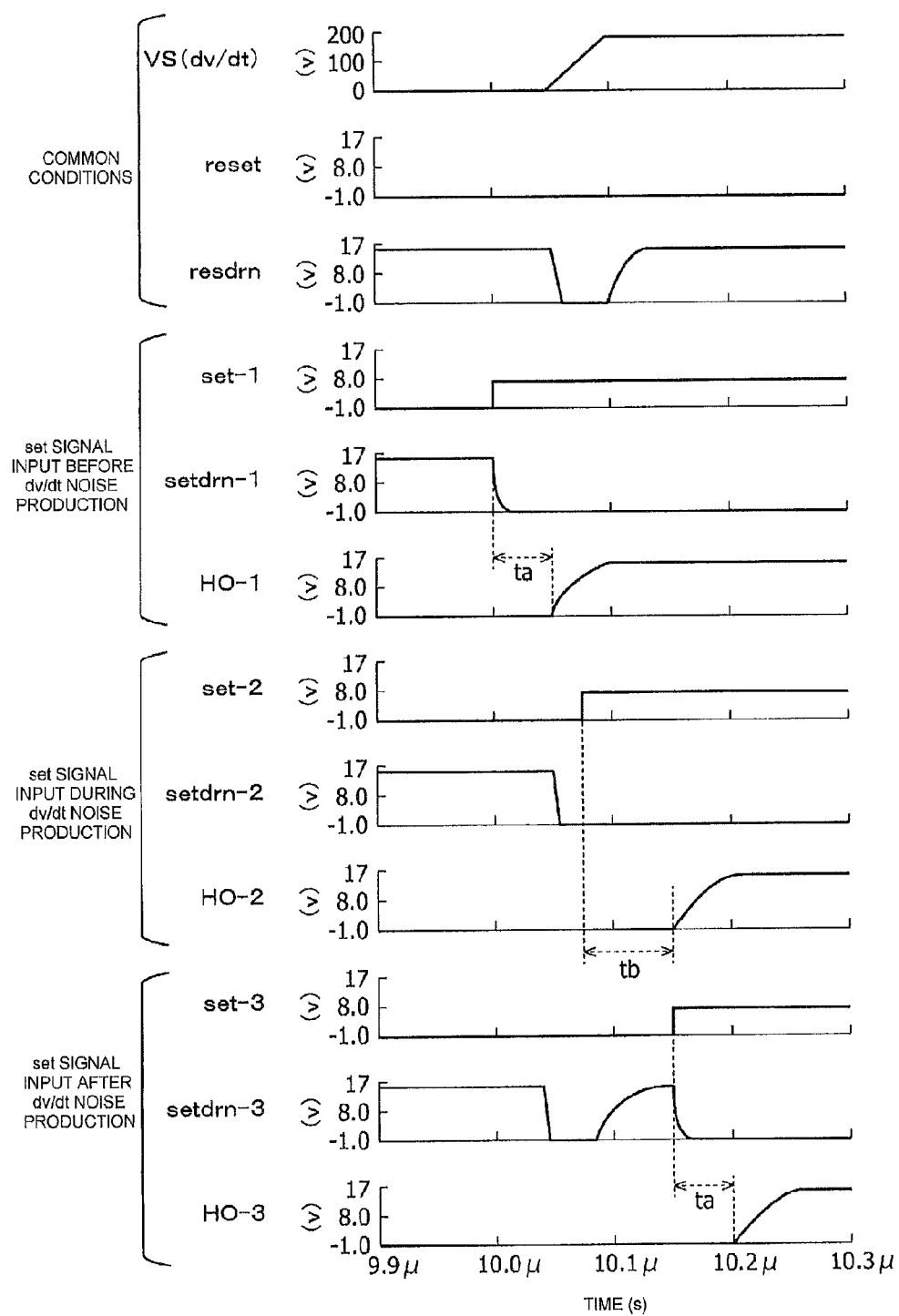
FIG. 9 is a timing chart for explaining operations of the related level shift circuit shown in FIG. 5.

Thus, according to the embodiment, as is apparent from the comparison between the output signal HO-2 shown in FIG. 3 and the output signal HO-2 shown in FIG. 9, the delay of the output signal HO-2, being in a state in which the level of the set signal (set-2) becomes "H" level when the voltage Vs is rising, can be reduced. Therefore, it becomes possible to reduce the delay in the turning-on operation of the switching device XD1 to lower the power loss by a diodes $D_H$ connected in parallel to the switching devices XD1.

Incidentally, the initiation of oscillation of the output signal OR_OUT of the logical sum circuit OR1 can not always transmit the set signal (set-2) to the latch circuit 23 with any timing. Namely, the minimum value (complete "L" level) of the output signal of the logical sum circuit OR1 makes the P-channel MOS transistors PM1$a$ and PM2$a$ completely turned-on to cause the levels of the level shift drain signals (setdrn-2 and resdrn) to be incomplete "L" levels even though the N-channel MOS transistors HVN1 and HVN2 are turned-on. Thus, there is a possibility of transmitting no set signal (set-2) to the latch circuit 23.

Moreover, in reverse to the foregoing, the maximum value (complete "H" level) of the output signal OR_OUT of the logical sum circuit OR1 makes the P-channel MOS transistors PM1$a$ and PM2$a$ completely turned-off. In this case, the latch malfunction protecting circuit 22 becomes in a state of being only operated so as to exhibit an original latch malfunction protecting function. Thus, no set signal (set-2) is to be transmitted to the latch circuit 23.

Therefore, actually, in a transition region (region of neither the maximum value nor the minimum value) of the oscillating waveform of the output signal OR_OUT of the logical sum circuit OR1, the set signal (set-2) is to be transmitted to the latch circuit 23. However, some settings of the on-resistance values of the MOS transistors allows the set signal (set-2) to be transmitted to the latch circuit 23 even when the value of the output signal OR_OUT is the minimum.

Moreover, when the level of the set signal (set-3) becomes "H" level after the rising of the voltage Vs due to a dead time is finished, no latch malfunction protecting function of the latch malfunction protecting circuit 22 is operated. Thus, the output signal HO-3 of the high side driver 21 rises with a delay by the above described delay time to characteristic to the circuits 22 and 23 and the high side driver 21 and, at the same time, the switching device XD1 is made turned-on.

In addition, explanations have been made with respect to the case in which the level of the set signal becomes "H" level. However, also in the case in which the level of the reset signal (reset) is changed to "H" level, the reset signal (reset) is transmitted to the latch circuit 23 in the same way.

In the next, explanations will be made with respect to a level shift circuit according to another embodiment of the invention with reference to FIG. 4, a circuit diagram showing a half bridge driving circuit using the level shift circuit. The level shift circuit according to another embodiment is provided in a high side driving unit 2-2 forming the half bridge driving circuit.

The level shift circuit according to the embodiment differs from the level shift circuit shown in FIG. 1 in that P-channel MOS transistors PM1 and PM2, resistors LSR1$b$ and LSR2$b$ and an inverter INV are added and that a latch malfunction protecting circuit 22 and latch circuit 23 are used with configurations shown in the diagram.

The P-channel MOS transistors PM1 and PM2 are connected in parallel to resistors LSR1$a$ and LSR2$a$ (corresponding to the resistors LSR1 and LSR2 shown in FIG. 1) with the gate terminals thereof being connected to the second and first connection points P2 and P1, respectively.

The resistor LSR1$b$ is connected to the first connection point P1 with one end thereof and is connected to the output terminal of the inverter INV with he other end thereof. Moreover, the resistor LSR2$b$ is connected to the second connection point P2 with one end thereof and is connected to the output terminal of the latch circuit 23 with the other end thereof. To the output terminal of the latch circuit 23, the input terminal of the inverter INV is also connected.

The resistors LSR1b and LSR2b, the inverter INV, and the P-channel MOS transistors PM1 and PM2 form a feedback circuit.

The resistors LSR1a and LSR2a have equal resistance values and the resistor LSR1b and LSR2b have equal resistance values.

The latch malfunction protecting circuit 22 in the embodiment is provided with an inverter 22a and a series circuit of P-channel MOS transistors 22b and 22c and N-channel MOS transistors 22d and 22e. The inverter 22a has the input terminal thereof connected to the second connection point P2 and, along with this, has the output terminal thereof connected to the gate of the P-channel MOS transistor 22c and the gate of the N-channel MOS transistor 22e. The gate of the P-channel MOS transistor 22b and the gate of the N-channel MOS transistor 22d are connected to the first connection point P1 and the connection point of the P-channel MOS transistor 22c and the N-channel MOS transistor 22d is connected to the input terminal of the latch circuit 23. To the series circuit of the P-channel MOS transistors 22b to 22e and to the inverter 22a, the output voltage E1 of the power supply PS1 is applied as a power supply voltage.

While, the latch circuit 23 in the embodiment is formed of inverters 23a and 23b connected in series and a resister 23c connected between the input terminal of the inverter 23a (the input terminal of the latch circuit 23) and the output terminal of the inverter 23b (the output terminal of the latch circuit 23) rather than a reset-set flip-flop. To the inverters 23a and 23b, the output voltage E1 of the power supply PS1 is applied as a power supply voltage.

The latch circuit 23 has a function of memorizing and outputting the value of an inputted signal, namely an output signal of the latch malfunction protecting circuit 22, when the level of the signal is "L" level or "H" level and, when the output signal of the latch malfunction protecting circuit 22 becomes to have a high impedance, holding and outputting a value memorized immediately before the output signal becomes to have the high impedance.

The latch malfunction protecting circuit 22 is operated, when dv/dt noises are produced to cause the voltages of both of the level shift drain signals (setdrn and resdrn) to become "L" levels, so that the output of the circuit 22 becomes to have a high impedance. Namely, when the voltages of both of the level shift drain signals (setdrn and resdrn) become "L" levels, both of the N-channel MOS transistor 22d and the P-channel MOS transistors 22c are turned-off to make the impedance at each of the output terminals thereof become a high impedance.

When the impedance at the output terminal of the latch malfunction protecting circuit 22 becomes a high impedance, the latch circuit 23 holds the previous state, by which influence of dv/dt noises can be avoided.

When the levels of both of the set signal (set) and the reset signal (reset) are "L" levels, that is, when the voltage levels of both of the level shift drain signals (setdrn and resdrn) are "H" levels, the P-channel MOS transistors 22b and N-channel MOS transistor 22e are made turned-off, which makes the output impedance of the latch malfunction protecting circuit 22 high. As a result, the latch circuit 23 is to continue to hold the previous state.

In this way, in the embodiment, when dv/dt noises are produced, the output impedance of the latch malfunction protecting circuit 22 becomes high to eliminate the influence of the dv/dt noises.

Figure 4:
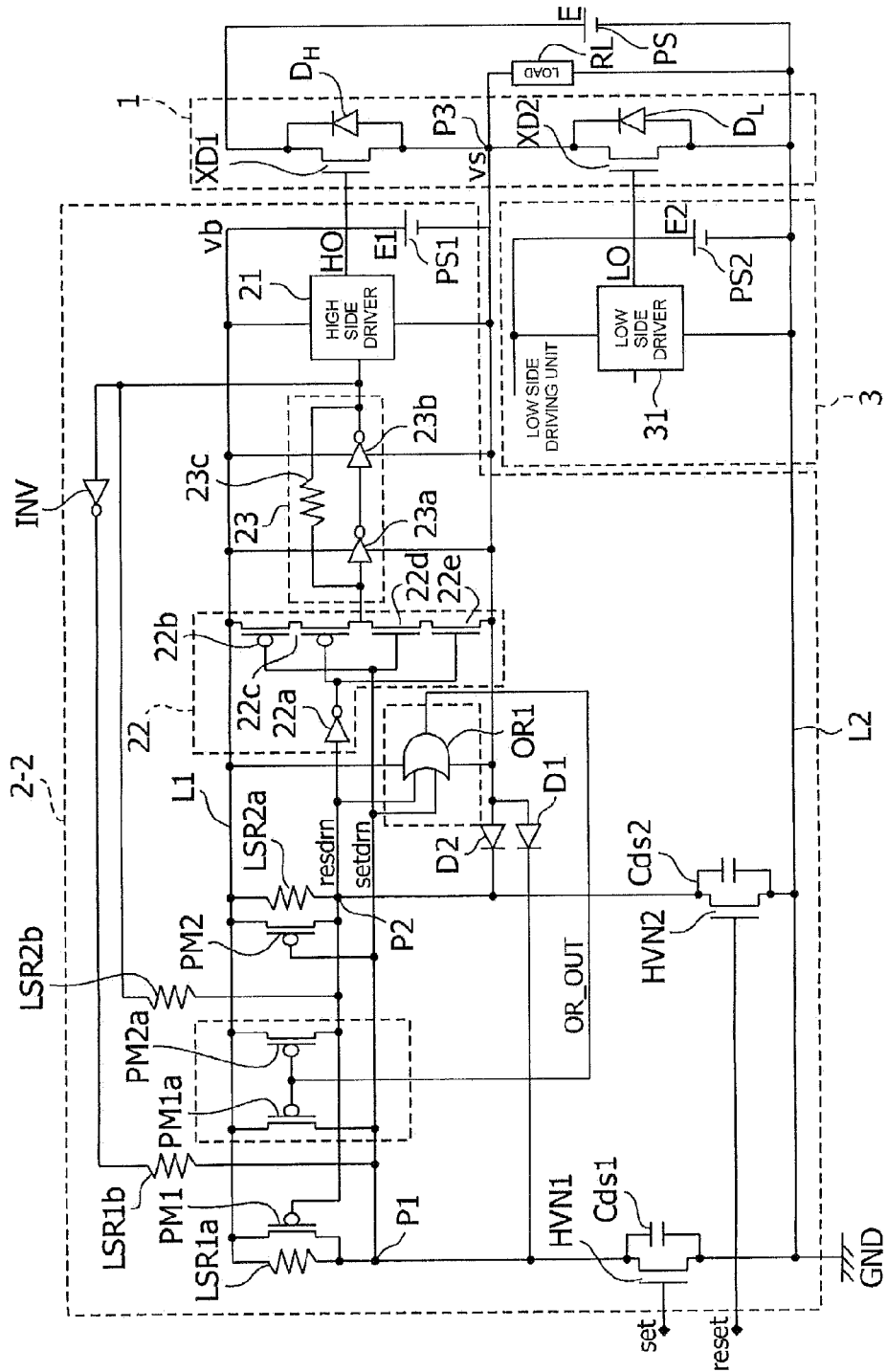
FIG. 4 is a circuit diagram showing a half bridge driving circuit using a level shift circuit according to another embodiment of the invention.

The configuration of the latch malfunction protecting circuit 22 is not limited to that shown in FIG. 4. Namely, it is necessary only that the circuit has a configuration which increases an output impedance when the level of the voltage of each of the level shift drain signals (setdrn and resdrn) becomes "L" level and, when one of the levels of the voltages becomes "L" level, outputs a voltage with the level corresponding thereto.

Following this, the resistors LSR1 and LSR2 will be explained.

In FIG. 4, on the side opposite to the side on which the resistors LSR1b and LSR2b are connected to the resistors LSR1a and LSR2a at the first connection point P1 and the second connection point P2, respectively, the resistor LSR1b is connected to the output side of the latch circuit 23 through the inverter INV, while the resistor LSR2b directly. Therefore, the levels of the terminals of the resistors LSR1b and LSR2b on this side are given so that, for example, when the level of one is "H" level, the level of the other becomes "L" level depending on the logic level of the output signal of the latch circuit 23. Thus, of the first connection point P1 and the second connection point P2, one connection point connected to a resistor with the level of a terminal on the side opposite to the connection point being "H" level is to be referred to as an "H" connection point and the other connection point connected to a resistor with the level of a terminal on the side opposite to the connection point being at "L" level is to be referred to as an "L" connection point.

Here, letting the voltage level at the end of the resistor LSR1b on the side opposite to the first connection point P1 be "H" level and letting the voltage level at the end of the resistor LSR2b on the side opposite to the second connection point P2 be "L" level, since a gate of the P-channel MOS transistor PM1 becomes "L" level, the P-channel MOS transistor PM1 is turned on to function as a pull-up resistor. As a result, the first connection point P1 is merely pulled up by the resistors LSR1a, LSR1B and the P-channel MOS transistor PM1, and has no element to be pulled down. Further, an "H" level to be pulled up is a voltage E1 that is based on the voltage Vs. Therefore, the voltage level of the level shift drain signal (setdrn) that is output from the first connection point P1 is equal to the voltage E1 that is based on the voltage Vs.

Also in the case in which the level at the end of the resistor LSR1b on the side opposite to the first connection point P1 is "L" level and the level at the end of the resistor LSR2b on the side opposite to the second connection point P2 is "H" level, the voltage dividing ratio by the resistors LSR1a and LSR1b is determined previously so that the level of the divided voltage, into which the voltage E1 is divided by the resistors LSR1a and LSR1b, is "H" level for the latch malfunction protecting circuit 22. Namely, the voltage of a level shift drain signal (setdrn) outputted from the first connection point P1, that is, the voltage into which the voltage E1 is divided by the resistors LSR1a and LSR1b (=E1·$R_{LSR1b}/(R_{LSR1a}+R_{LSR1b})$), where $R_{LSR1a}$ and $R_{LSR1b}$ are resistance values of the resistors LSR1a and LSR1b, respectively, is provided so as to become higher than the threshold voltage of the inverter formed of the MOS transistors 22b and 22d in the latch malfunction protecting circuit 22, that is, the threshold voltage of the latch malfunction protecting circuit 22 relative to the voltage of the signal (setdrn).

Determinations of the voltage dividing ratio by the resistors LSR1a and LSR1b and the voltage dividing ratio by the resistors LSR2a and LSR2b in this way assure that "When an input signal of "L" level is inputted to only one of terminals for input signals (set and reset) to the high side driving unit 2-2, the latch malfunction protecting circuit 22 blocks no input signal".

Next to this, a feedback circuit will be explained which includes the resistors LSR1b and LSR2b, the inverter INV and the P-channel MOS transistors PM1 and PM2.

Letting the resistance values of the resistors LSR1a and resistor LSR2a be equal, the resistance values of the resistors LSR1b and resistor LSR2b be equal and the on-resistance of each of the P-channel MOS transistors PM1 and PM2 be temporarily neglected, the gate-source voltage is zero in a P-channel MOS transistor with the gate thereof connected to an H connection point (a connection point of "H" level of the first and second connection points P1 and P2, respectively). Moreover, the gate-source voltage becomes E1·Ra/(Ra+Rb) in a P-channel MOS transistor with the gate thereof connected to an L connection point (a connection point of "L" level of the first and second connection points P1 and P2, respectively), where Ra is the resistance value of either the resistor LSR1a or LSR2a and Rb is the resistance value of either the resistor LSR1b or LSR2b.

The value of the gate-source voltage E1·Ra/(Ra+Rb) is set to be somewhat larger than the values of the threshold voltages of the P-channel MOS transistors PM1 and PM2. This allows the MOS transistor with the gate thereof connected to the L connection point to have a finite on-resistance Ron and a configuration is provided in which the MOS transistor with the on-resistance Ron is connected in parallel to the resistor LSR1a or LSR2a. For example, letting the output voltage E1 be as E1=15V, the threshold voltage of each of the P-channel MOS transistors PM1 and PM2 be 2.5V, the resistance value Ra of each of the resistors LSR1a and LSR2a be as $R_{LSR1a}=R_{LSR2a}=Ra=10$ kΩ and the resistance value Rb of each of the resistors LSR1a and LSR2a be as $R_{LSR1b}=R_{LSR2b}=Rb=45$ kΩ, the gate-source voltage becomes as E1·Ra/(Ra+Rb)=2.7V which is higher than the threshold voltage by 0.2V.

In this way, in the embodiment, the value of the gate-source voltage E1·Ra/(Ra+Rb) of a P-channel MOS transistor, whose gate is connected to an L connection point (either the P-channel transistor PM1 or PM2 whose drain terminal is connected to an H connection point), is set so as to become a value close to the value of the threshold voltage of either the P-channel MOS transistor PM1 or PM2, by which the value of the on-resistance Ron comes to be a finite value that is not zero. Therefore, even though the N-channel MOS transistors HVN1 or HVN2 connected to the H connection point is turned-on, a through current is prevented from flowing between a position at the voltage Vb and a position at the ground voltage.

Of the parallel connection of the P-channel MOS transistors PM1 and the resistor LSR1a and the parallel connection of the P-channel MOS transistors PM2 and the resistor LSR2a, a parallel connection having a P-channel MOS transistor with the gate thereof connected to the L connection point (connection point at "L" level) to provide the on-resistance Ron is connected between the H connection point (connection point at "H" level) and the power supply line L1. Therefore, the combined resistance value between the H connection point and the power supply line L1 becomes lower than the combined resistance value between the H connection point and the power supply line L1 in the embodiment shown in FIG. 1. While, to the L connection point, the on-resistance Ron is to have no relation.

As was described in the foregoing, because of the presence of parasitic capacitances Cds1 and Cds2 between the source and drain of the N-channel MOS transistor HVN1 and between the source and drain of the N-channel MOS transistor HVN2, respectively, the on-resistance Ron causes such a difference between a time constant to the H connection point and a time constant to the L connection point as to make the time constant of the former shorter than the constant of the latter.

As a result, when the voltages at the H connection point and the L connection point vary by dv/dt noises, the voltage at the H connection point varies faster than the voltage at the L connection point. Therefore, when the voltages at both of the H connection point and L connection point rise, a large difference is caused between the time required for the voltage at the H connection point to reach the threshold voltage of the inverter in the latch malfunction protecting circuit 22 (the threshold voltage of the inverter formed of the inverter 22a and the MOS transistors 22b and 22d) and the time required for the voltage at the L connection point to reach the same threshold voltage. The latch circuit 23 is set or reset so that the original value is kept as a result by the time difference. Therefore, according to the embodiment, malfunction prevention against dv/dt noises can be ensured more.

As was explained in the foregoing, the feedback circuit including the resistors LSR1b and LSR2b, the inverter INV, and the P-channel MOS transistors PM1 and PM2 pulls up the voltage at one of the first connection point P1 and the second connection point P2 to the high voltage side power supply voltage in the secondary voltage system and, along with this, pulls down the voltage at the other to the low voltage side power supply voltage in the secondary side voltage system to thereby ensure malfunction prevention against dv/dt noises more.

Also in the level shift circuit according to the embodiment, like the level shift circuit shown in FIG. 1, an advantage can be obtained which reduces the delay in the turning-on operation of the switching device XD1 to lower the power loss by a diodes $D_H$.

In the foregoing, the threshold voltage of the inverter 22a and the threshold voltage of the inverter formed by the MOS transistors 22b and 22d are made to be equal. This, however, is for simplifying the explanation and there is no necessity to make the threshold voltages equal.

Figure 8:
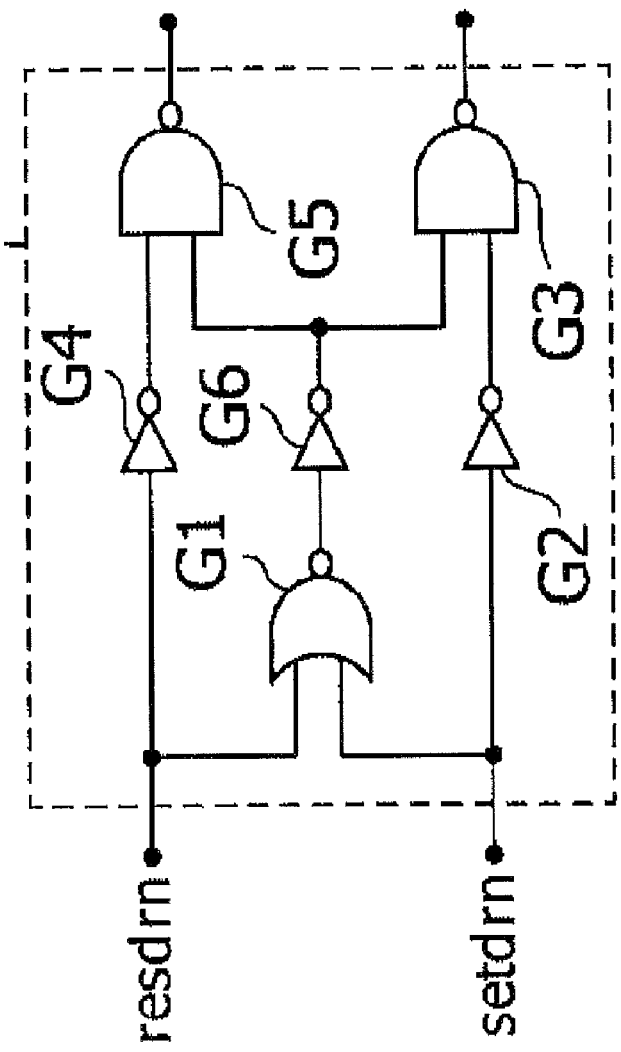
FIG. 8 is a circuit diagram showing an example of a configuration of a related latch malfunction protecting circuit.

Moreover, also in the embodiment, for the latch malfunction protecting circuit 22, the circuit with the configuration shown in FIG. 8 is used and, for the latch circuit 23 combined with the latch malfunction protecting circuit 22, a reset-set flip-flop can be used.

In addition, the logical sum circuit OR1 may be a circuit actualizing the foregoing operation (a logic gate circuit), and is not limited to a simple logical sum circuit (OR gate circuit).

While the present invention has been particularly shown and described with reference to the preferred embodiments thereof, it will be understood by those skilled in the art that the foregoing and other changes in form and details can be made therein without departing from the spirit and scope of the present invention.

What is claimed is:
1. A level shift circuit configured to transmit an input signal from a primary side voltage system to a system that is operated by a secondary side voltage system and that is different from the primary side voltage system, the circuit comprising:
 a first series circuit including a first resistor and a first switching device, the first series circuit being connected between a high voltage side power supply voltage in the secondary side voltage system and a low voltage side power supply voltage in the primary side voltage system;

a second series circuit including a second resistor and a second switching device, the second series circuit being connected between the high voltage side power supply voltage in the secondary side voltage system and the low voltage side power supply voltage in the primary side voltage system;

a latch malfunction protecting circuit configured to operate in the secondary side voltage system, and being configured to have a voltage inputted at a first connection point, the first connection point being configured to connect the first resistor and the first switching device;

the latch malfunction protecting circuit being configured to have a voltage inputted at a second connection point, the second connection point being configured to connect the second resistor and the second switching device;

a latch circuit configured to operate in the secondary side voltage system and configured to receive an output of the latch malfunction protecting circuit as input;

a third switching device connected in parallel to the first resistor;

a fourth switching device connected in parallel to the second resistor; and a logic gate circuit configured to operate in the secondary side voltage system and configured to have the voltage at the first connection point inputted and to have the voltage at the second connection point inputted, the first switching device having a signal inputted in the primary side voltage system that is configured to selectively turn-on and turn-off the first switching device;

the second switching device having a signal inputted in the primary side voltage system that is configured to selectively turn-on and turn-off the second switching device, the latch malfunction protecting circuit being configured to transmit a signal based on the voltages at the first and second connection points when any one of the first and second switching devices is turned-on, the latch malfunction protecting circuit being configured to selectively stop transmission of the signal based on the voltages at the first and second connection points when the first and second switching devices are simultaneously turned-on; and the logic gate circuit being configured to turn-on the third and fourth switching devices when both of the voltages at the first and second connection points are lower than a threshold voltage of the logic gate circuit.

2. The level shift circuit of claim 1, further comprising a feedback circuit configured to increase the voltage at one of the first and second connection points to the high voltage side power supply voltage in the secondary side voltage system and to decrease the voltage at the other connection point to the low voltage side power supply voltage in the secondary side voltage system.

3. The level shift circuit of claim 2, wherein the feedback circuit comprises:

a third resistor having a first end thereof connected to the first connection point and a second end having an inverting signal of the output signal of the latch circuit being applied to the second end of the third resistor, and a fourth resistor having a first end thereof connected to the second connection point and a second end having a non-inverting signal of the output signal of the latch circuit being applied to the second end of the fourth resistor.

4. The level shift circuit of claim 1, wherein the latch malfunction protecting circuit is configured to provide a high output impedance when both of the voltages at the first and second connection points are lower than the threshold voltage of the latch malfunction protecting circuit.

5. The level shift circuit of claim 1, wherein the latch malfunction protecting circuit comprises:

an inverting device;

a P-channel MOS transistor series circuit in which a first P-channel MOS transistor and a second P-channel MOS transistor are connected in series; and an N-channel MOS transistor series circuit in which a first N-channel MOS transistor and a second N-channel MOS transistor are connected in series;

the P-channel MOS transistor series circuit and the N-channel MOS transistor series circuit being connected in series between the high voltage side power supply voltage and the low voltage side power supply voltage in the secondary side voltage system;

the first connection point being connected to gates of the first P-channel MOS transistor and the first N-channel MOS transistor;

the second connection point being connected to an input terminal of the inverting device, an output terminal of the inverting device being connected to gates of the second P-channel MOS transistor and the second N-channel MOS transistor; and a connection point of the P-channel MOS transistor series circuit and the N-channel MOS transistor series circuit being connected to a data input terminal of the latch circuit.

6. The level shift circuit of claim 5, wherein the threshold voltage of the logic gate circuit is set to be equal to or less than the threshold voltage of the latch malfunction protecting circuit.

7. The level shift circuit of claim 4, wherein the latch circuit comprises a buffer circuit including a resistor connected between the input side and the output side of the buffer circuit.

8. The level shift circuit of claim 7, wherein the buffer circuit comprises two inverting devices connected in series.

9. The level shift circuit of claim 3, further comprising a third P-channel MOS transistor connected in parallel to the first resistor and a fourth P-channel MOS transistor connected in parallel to the second resistor, the third P-channel MOS transistor having a gate connected to the connection point of the second resistor and the fourth resistor, and the fourth P-channel MOS transistor having a gate connected to the connection point of the first resistor and the third resistor.

10. The level shift circuit of claim 9, wherein:

the inverting signal of the output signal of the latch circuit has the low voltage side power supply voltage in the secondary side voltage system, and a voltage dividing ratio by the first resistor and the third resistor being determined so that the voltage at the first connection point when the first switching device and the third switching device are turned-off is between:

a voltage determined by subtracting the threshold voltage of the fourth P-channel MOS transistor from the high voltage side power supply voltage in the secondary side voltage system, and a voltage determined by adding the threshold voltage of the latch malfunction protecting circuit relative to the voltage at the first connection point to the low voltage side power supply voltage in the secondary side voltage system, and the non-inverting signal of the output signal of the latch circuit has the low voltage side power supply voltage in the secondary side voltage system and, a voltage dividing ratio by the second resistor and the fourth resistor being determined so that the voltage at the second connection point when the second switching device and the fourth switching device are turned-off is between:
a voltage determined by subtracting the threshold voltage of the third P-channel MOS transistor from the high voltage side power supply voltage in the secondary side voltage system, and
a voltage determined by adding the threshold voltage of the latch malfunction protecting circuit relative to the voltage at the second connection point to the low voltage side power supply voltage in the secondary side voltage system.

* * * * *